(12) United States Patent
Ohshita et al.

(10) Patent No.: US 7,745,987 B2
(45) Date of Patent: Jun. 29, 2010

(54) ORGANIC ELECTROLUMINESCENT DISPLAY DEVICE

(75) Inventors: Isamu Ohshita, Yamagata-ken (JP); Teruichi Watanabe, Yamagata-ken (JP); Gen Suzuki, Yamagata-ken (JP); Kunizo Ogoshi, Yamagata-ken (JP); Teruo Tohma, Yamagata-ken (JP)

(73) Assignee: Tohoku Pioneer Corporation, Yamagata-ken (JP)

( * ) Notice: Subject to any disclaimer, the term of this patent is extended or adjusted under 35 U.S.C. 154(b) by 1139 days.

(21) Appl. No.: 10/620,354

(22) Filed: Jul. 17, 2003

(65) Prior Publication Data

US 2004/0012330 A1    Jan. 22, 2004

(30) Foreign Application Priority Data

Jul. 18, 2002    (JP)    ............................... 2002-209869
Sep. 26, 2002    (JP)    ............................... 2002-281110

(51) Int. Cl.
*H05B 33/00*    (2006.01)
(52) U.S. Cl. ..................................................... 313/504
(58) Field of Classification Search ......... 313/160–161, 313/153, 545, 550, 635, 490–493, 564–566; 427/66–67; 315/267
See application file for complete search history.

(56) References Cited

U.S. PATENT DOCUMENTS

| | | | |
|---|---|---|---|
| 5,294,870 A * | 3/1994 | Tang et al. ................... | 313/504 |
| 5,693,428 A | 12/1997 | Fujii et al. | |
| 6,072,450 A * | 6/2000 | Yamada et al. ................ | 345/76 |
| 6,366,025 B1 | 4/2002 | Yamada | |
| 6,498,592 B1 * | 12/2002 | Matthies ..................... | 345/1.1 |

(Continued)

FOREIGN PATENT DOCUMENTS

EP    0905672 A1    3/1999

(Continued)

OTHER PUBLICATIONS

Shirai, Satoshi, et al., "Fabrication of Multi Color Polymer EL Devices using the Photo-bleaching Method," J. Photopolym. Sci. Technol., vol. 14, No. 2, 2001, pp. 317-322.

(Continued)

*Primary Examiner*—Nimeshkumar D Patel
*Assistant Examiner*—Anthony T Perry
(74) *Attorney, Agent, or Firm*—Arent Fox LLP

(57) ABSTRACT

An organic electroluminescent display device includes organic electroluminescent films, each containing organic electroluminescent materials and sandwiched by a pair of electrodes, each forming a plurality of light-emitting elements above a substrate. Each pixel of the display device is composed of two different colors light-emitting elements, and the chromaticity of each color is controlled by changing the concentration of organic electroluminescent materials or by adding foreign materials thereto. For example, if the chromaticity of the red light-emitting element is set to a value shifted toward green side, various colors including white can be produced by mixing this red with blue of the blue light-emitting element. Then, the organic electroluminescent display device can produce high-quality quasi-color images by mixing two colors of which chromaticity values are properly controlled. By virtue of a two-color structure, the aperture ratio becomes high and the manufacturing process becomes simple.

12 Claims, 6 Drawing Sheets

U.S. PATENT DOCUMENTS

| | | | |
|---|---|---|---|
| 6,617,799 B2 * | 9/2003 | Koyama | 315/169.3 |
| 6,628,067 B2 * | 9/2003 | Kobayashi et al. | 313/504 |
| 6,693,611 B1 * | 2/2004 | Burroughes | 345/83 |
| 7,091,936 B1 | 8/2006 | Yamada | |
| 2002/0070663 A1 * | 6/2002 | Ogura et al. | 313/506 |

FOREIGN PATENT DOCUMENTS

| | | |
|---|---|---|
| GB | 2194376 A | 3/1988 |
| JP | 8-227276 | 9/1996 |
| JP | H08-315986 | 11/1996 |
| JP | H10-039791 | 2/1998 |
| JP | 11-52905 | 2/1999 |
| JP | H11-354273 | 12/1999 |
| JP | 2000-268958 | 9/2000 |
| JP | 2000-268978 | 9/2000 |
| JP | 2000-321098 | 11/2000 |
| JP | 2001-109399 | 4/2001 |
| JP | 2001-290441 | 10/2001 |
| JP | 2002-134273 | 5/2002 |

OTHER PUBLICATIONS

Burrows, P.E., et al.,"Color-Tunable Organic Light-Emitting Devices," Appl. Phys. Lett. 69 (20), Nov. 11, 1996, pp. 2959-2961.

* cited by examiner

ORGANIC ELECTROLUMINESCENT DISPLAY DEVICE

BACKGROUND OF THE INVENTION

The present invention relates to an organic electroluminescent display device including light-emitting films containing organic electroluminescent materials.

The present application claims priority from Japanese Patent Application Nos. 2002-209869 and 2002-281110, the respective disclosures of which are incorporated herein by reference.

It is known that the electroluminescence (hereafter, referred to as EL) of organic compound materials which emit light by current injection is utilized in display devices (organic EL display devices) The EL display device has many pixels arrayed in a predetermined pattern on a planar substrate. Each pixel is composed of organic EL display elements made of organic EL films.

As a result of research efforts, organic compound materials which can emit red (R), green (G) and blue (B) light of high purity have been developed, which are suited for organic luminescent displays represented by the organic EL display device. Now full color display devices are available which have R, G and B light-emitting elements in each pixel.

FIG. 1 is a diagram illustrating a prior art organic electroluminescent display device, which is capable of providing color images, as disclosed in Japanese Patent Application Laid-open No. Hei 8-227276. On a transparent substrate 1, this organic electroluminescent display device has scan signal lines 2 and data signal lines 3 which are arrayed to intersect at right angles and electrically isolated from each other, non-linear elements 4 each connected to the scan signal line 2 and the data signal line 3, and first display electrodes 5, which are connected to the non-linear elements 4, of independent array patterns each corresponding to the R, G and B light-emitting elements. On the first display electrode 5, a different organic electroluminescent film is deposited for each color, and a common second display electrode (not shown) is further deposited on the organic electroluminescent film.

In such an organic electroluminescent display device, R, G and B light-emitting elements constitute a display unit (pixel) in combination, and full-color images are provided by driving the individual light-emitting elements.

In addition, Japanese Patent Application Laid-open No. Hei.11-52905 discloses a technique using two light-emitting diodes (LEDs) of different colors per pixel for providing multicolor images by mixing the two gray-scaled colors.

There is a problem in the former case, i.e., in the conventional organic electroluminescent display device where a display unit is composed of three light-emitting elements, that the ratio of luminescent areas per pixel (aperture ratio) is low. This is because non-luminescent margins for wiring exist around the light-emitting elements. Another problem posed in the prior art is that the manufacturing process is complex because the three light-emitting elements need to be formed one by one on the substrate.

The above problems could be avoided by constituting the light-emitting elements with a single light-emitting element per pixel. However, in turn, there arises another problem that such a display device only provides monochrome gray-scale images, instead of versatile color images.

Moreover, in using LEDs as light sources as shown in the latter prior art, it is difficult to precisely control the chromaticity of emitted light. Therefore, high-quality two-color images are not provided by such an approach because of the limited chromaticity range attained by mixing LED colors.

SUMMARY OF THE INVENTION

The present invention focuses on concentrations of organic electroluminescent materials, device structure and selected materials, so as to control the chromaticity of emitted light and thereby solve the above problems. An object of the present invention is to provide an organic electroluminescent display device that presents high-quality color images by mixing two colors emitted from selected two light-emitting elements of which chromaticity values are properly controlled. By virtue of a two-color structure, the aperture ratio becomes high and the manufacturing process becomes simple, while high-quality color images are provided. In addition, the two-color structure can save the use of organic materials, compared with the three-color structure.

In order to achieve the above and other objects, the present invention provides characteristics as follows.

According to a first characteristic of the present invention, there is provided an organic electroluminescent display device including a plurality of light-emitting elements which are formed above a substrate by light-emitting films each containing organic electroluminescent materials and being sandwiched by a pair of electrodes, wherein each pixel of the display device is formed by two light-emitting elements producing two different colors of predetermined chromaticity values and each of the color has a gradation.

According to this characteristic, the present invention utilizes an advantage of organic electroluminescent elements that the chromaticity of emitted light can be changed as desired to some extent. By properly controlling the chromaticity of light emitted from each of the two light-emitting elements which constitute a pixel, it becomes possible to provide versatile high-quality quasi-color images by controlling the gradation of each color with the two-color structure.

With reference to FIG. 2, which is a CIE xy chromaticity diagram illustrating an embodiment of the present invention, if the colors produced by the R, G, and B light-emitting elements are set to have chromaticity values ($L_R$, $L_G$, $L_B$) of high purity, the chromaticity gamut becomes large and versatile color imaging are provided with the three-color structure. On the other hand, if one tries to produce color images from only two of R, G and B (i.e. two-color structure), then any of the combinations, ($L_R$, $L_G$), ($L_G$, $L_B$) and ($L_R$, $L_B$) cannot produce a color mixture close to pure white O of which coordinate is (0.31, 0.316) in the chromaticity diagram. As a result, the obtained color images are poor in quality.

In contrast, chromaticity values of $E_R$, $E_G$ and $E_B$ produced by organic electroluminescent elements are not so pure as $L_R$, $L_G$ and $L_B$. In addition, the chromaticity values of $E_R$, $E_G$ and $E_B$ can be shifted toward G or B side, R or B side, and G or R side under various setting conditions, respectively. Then, if two colors, for example, ($E_{R1}$, $E_{B1}$) are selected, their combination can produce colors close to pure white O in the chromaticity diagram. By controlling the gradation of each color, the two colors can be shifted toward the $E_R$ side and $E_B$ side, with a near-white color in the center. Then versatile high-quality quasi-color images are provided.

A second characteristic of the present invention is based on the above-mentioned first characteristic, in which a mixture of the two different colors can produce a white color which is designated by a white region in a CIE xy chromaticity diagram.

In this way, the chromaticity values of the two selected colors are controlled so that the coordinate of combination ($E_R$, $E_G$), ($E_G$, $E_B$) or ($E_R$, $E_B$) with respect to the chromaticity values of $E_R$, $E_G$ and $E_B$ falls within a circular range Sw as the white color region in the CIE xy chromaticity diagram of JIS Z 8110, as shown in FIG. 3. Then the chromaticity coordinates can be moved toward the $E_R$, $E_G$ or $E_B$ side with the white color disposed in the center, and versatile high-quality quasi-color images can be provided.

A third characteristic is based on the display device described in the first characteristic, in which a mixture of the two different colors can produce color whose choromaticity falls within a circular area of a 0.1 radius with its center in the coordinate (0.31, 0.316) of the pure white O in the CIE xy chromaticity diagram.

This can be done by controlling the chromaticity values of $E_R$, $E_G$ and $E_B$, so that the chromaticity of color mixture yielded from combination such as ($E_R$, $E_G$), ($E_G$, $E_B$) or ($E_R$, $E_B$) falls within a circular range $S_O$, as shown in FIG. 2. Thereby, the versatile high-quality quasi-color images can be produced because the chromaticity of color mixture can be moved from that of a near-white color toward that of $E_R$, $E_G$ or $E_B$ to shift colors.

A forth characteristic is based on the foregoing characteristics, in which the two different colors are selected from red (R), green (G), blue (B), cyan (C), magenta (M) and yellow (Y).

That is, the above color combinations ($E_R$, $E_G$), ($E_G$, $E_B$) and ($E_R$, $E_B$), for example, may be (R, G), (G, B) and (R, B). If $E_R$ is shifted toward the G side, it turns to be yellow (Y). Then it produces another combination (Y, B). In this way, the chromaticity coordinates of color mixture can be moved to the $E_R$, $E_G$ or $E_B$ side, with a near-white color in the center, and so high-quality quasi-color images can be provided.

A fifth characteristic is that one of the two different colors is white and the other is one selected from red (R), green (G), blue (B), cyan (C), magenta (M) and yellow (Y). Then the produced color can be changed from white to other colors, and thereby versatile high-quality quasi-color images are provided.

A sixth characteristic is based on the foregoing characteristics, in which the chromaticity value is controlled by changing the concentration of the organic electroluminescent materials or by coupling with foreign materials.

It is known in organic electroluminescent elements that the chromaticity of emitted color can be controlled by varying the concentration of the organic electroluminescent material (dopant) contained in the electroluminescent film or by adding foreign materials to the film. This technique provides versatile high-quality quasi-color images using only two selected colors by properly controlling the chromaticity values of $E_R$, $R_G$ and $E_B$.

A seventh characteristic is based on the foregoing characteristics, in which the chromaticity value is controlled by varying the thickness of the electroluminescent film.

Some organic electroluminescent elements have a layered structure composed of various functional films, such as a hole injection layer, a hole transport layer, a light emitting layer an electron transport layer and an electron injection layer, for providing electroluminescent films. In such an organic electroluminescent element, it is known that if the thickness of each of the constituent electroluminescent films is changed, the chromaticity of emitted light changes as well because of light interference in such an optical multi-layered structure. Utilizing this phenomenon, it is possible to improve the quality of quasi-color images of two colors selected from the properly controlled chromaticity values of $E_R$, $E_G$ and $E_B$.

An eighth characteristic is based on the foregoing characteristics, in which each of the two light-emitting elements described above is formed by photo bleaching to the light-emitting films.

This photo bleaching process produces two light-emitting elements with different colors from the light-emitting film formed uniformly. That is, light-emitting films, which form two light-emitting elements composing a pixel, may be produced with the same structure or material. The photo bleaching process radiates electromagnetic wave (or light) partially to an organic light-emitting film, including organic dye working as luminescent centers, to degrade the organic dye at the exposed part by photoxidation or photodecomposition. Then, using this effect that the exposed and non-exposed part has different colors respectively, this process can produce two different color light-emitting elements. The film may contain a plurality of kinds of organic dyes; in this case one or more kinds of dyes will be degraded.

Irradiation of electromagnetic wave is carried out by a well-known exposure technology such as laser light scanning technique as well as a contact or projection exposure method using photo masks. Electromagnetic wave used has wavelength in the range from $10^{-17}$ to $10^5$ m, involving γ-ray, X-ray, ultraviolet-ray, visible light, infrared. Ultra-violet and visible lights are usually used.

Even the formation of two different color light-emitting elements by the photo-bleaching process makes it possible to provide versatile high-quality quasi-color images by setting the chromaticity of the two color of emitting lights to that of near white. The fabrication in this process is easier, comparing with an individual patterning process which forms each light-emitting element from each pattern since there is no necessity of the individual pattering. The chromaticity control in this case can be conducted by varying the intensity of irradiation, exposure time, or by changing a species of organic dyes in the light-emitting film, or the combination of these.

A ninth characteristic is based on the foregoing characteristic, in which the light-emitting elements are respective formed of color conversion filters that convert the light color from the light-emitting film.

This color conversion filter method produces two light-emitting elements with different colors from the light-emitting film formed uniformly. That is, light-emitting films, which form two light-emitting elements composing a pixel, may be produced with the same structure or material. The color conversion filter method is classified into two categories; color filter method and fluorescent color conversion method. Even the formation of two colors by these methods also makes it possible to provide versatile high-quality quasi-color images by appropriately setting the chromaticity of the two colors with the near-white color in the center. The fabrication by this method is also easier, comparing with the individual patterning process since there is no necessity of the individual patterning.

A tenth characteristic is that color conversion filters are used as the color filter method. The color filters may be formed by any one of the well-known fabrication methods as follows: Dyeing method is a method for forming each filter pattern from photosensitive dye substance, which is made from gelatin, glue or polyvinyl alcohol by applying dichromic acid processing. Pigment diffusion methods include methods for forming each color filter pattern from colored resins, which are made from such resin as polyimido with diffusion of pigments, and methods for forming filter patterns from colored resins, which are made from such negative-resist as acrylic epoxy series or cross-linked type polyvinyl alcohol with diffusion of pigments. Electro deposition methods are patterning methods using electrochemical deposition in electrolytic solvent, dissolving such anionic resins as polyester resin or melanin resin, in which pigments diffuse. Printing methods are methods for forming each color filter by printing as inks, which are made from pigments, oleic acid or stearic acid, phenol alcohol and additives (for drying or adjusting viscosity).

Even the formation of two light-emitting elements with different colors by this color filter method makes it possible to provide versatile high-quality quasi-color images by setting the chromaticity of the two colors of emitting lights with the near-white color in the center. The fabrication by this method is also easier, comparing with the individual patterning process. The chromaticity control can be carried out by selecting color filter materials, pigments, color resins and inks.

An eleventh characteristic is using a fluorescent color conversion filter as a color conversion method. The filters absorb the near-ultraviolet or blue and blue-green lights from organic light-emitting film, and emit visible lights such as blue or blue-green to red by fluorescent emission. Fluorescent materials are, for example, shown below, but not limited to these. The above-mentioned fluorescent materials converting near-ultraviolet lights into blue lights include Bis-MSB(1,4-Bis(2-methylstyryl)benzene), DPS(trans-4,4-diphenylstylbenzene), coumarin4 (7-hydroxy-4-methylcoumarin). Fluorescent materials converting blue lights into green lights include coumarin153(2,3,5,6-1H,4H-tetrahydro-8-trifluromethylquinolizi no(9,9a,1-gh) coumarin), coumarin6(3-(2'-benzothiazolyl)-7-diethylaminocoumarin), coumarin7(3-(2'-benzimidazolyl)-7-N,N-diethylaminocoumarin). Fluorescent materials converting blue-green lights into red lights include DCM(4-dicyanomethylene-2-methyl-6-(p-dimethylaminostyryl)-4H-pyrane), pyridine1(1-ethyl-2-(4-(p-dimethylaminophenyl)-1,3-butadienyl)-pyridinium-perchlorate), and rhodamin dyes. The above mentioned fluorescent materials and resins or photo resists (being preferable to be transparent) containing fluorescent materials are deposited on a transparent substrate by the process of vapor deposition, spattering or optical lithography being described in the formation of the color filter, to produce color conversion filters.

Moreover, color conversion filter can be formed on color filter. If the color of the color conversion filter is adjusted to that of the underneath color filter, the problem that color conversion filters are fluorescent by the excitation of environmental lights to decrease the display contrast, can be eliminated.

Even the formation of two light-emitting elements with different colors by this fluorescent color conversion filter method makes it possible to provide versatile high-quality quasi-color images, if the two chromaticities of the emitting lights are chosen appropriately, with the near-white color in the center. The fabrication by this method is also easier, comparing with the individual patterning process that forms each of the light-emitting elements independently from the light-emitting film. The chromaticity control in this case can be carried out by controlling the thickness of color conversion filter and selecting fluorescent materials.

A twelfth characteristic is based on the foregoing characteristics, in which the light-emitting film is produced by coating or printing process.

This means that the light-emitting films are fluorescent polymer layers formed by coating or printing process. The polymer layer may be formed as single layer of fluorescent polymer or multi-layers containing a hole transport layer, a fluorescent emitting polymer layer and the like. The fluorescent polymer layers can be formed from solutions, which dissolve low molecular weight fluorescent dyes such as coumarin, perylene, pyrane, anthron, porphyrin, quinacridon, N,N'-dialkyl-substituted quinacridon or naphthalimido, N,N'-diaryl-substituted pyrrolopyrrole in polymers such as polystyrene, polymethyl methacrylate, polyvinyl carbazole. The fluorescent polymer layers can also be formed from solutions of fluorescent polymers such as polyaryl vinylene, polyfluorene, the solvents of which involve toluene, xylene, acetone, methyl ethyl ketone, methyl isobutyl ketone, cyclohexanone, methanol, ethanol, isopropyl alcohol, ethyl acetate, butyl acetate, water or a mixture of these. The formation of these uniform or patterning layers of fluorescent polymers can be conducted by coating or printing process including spin coating, spray coating, flexography, gravure printing, micro-gravure printing, and intaglio offset lithography.

Even the formation of two light-emitting elements with different colors by this method makes it possible to provide versatile high-quality quasi-color images, if the two chromaticities of the colors of emitting lights are set to that of near white. The usage of printing processes is suitable for fabrication of large display panels. The chromaticity control in this case can be carried out by choosing materials of light-emitting films or of fluorescent dyes and amount of additives.

A thirteenth characteristic is based on the foregoing characteristics, in which each emissive area of the two light-emitting elements with different colors is determined by taking each lifetime into consideration, to have nearly equal lifetimes.

The control of each chromaticity of the two elements may result in the difference of lifetimes of the elements. This difference can be offset by a design of each emissive area of element. For example, if the lifetime ratio of the two elements (element A and element B) is element A: element B=3:1, then, emissive areas of elements are determined to satisfy the following equation; emissive area of element A: that of element B=1:3.

Because that the determination of the ratio of emissive areas eliminates the difference between the lifetimes of two elements, the lifetime design for display device becomes easier, and freedom of element design in chromaticity control increases.

A fourteenth characteristic is based on the foregoing characteristic, in which the light-emitting element is driven by an electric current of a different level for each color. A fifteenth characteristic is based on the foregoing characteristic, in which that the light-emitting element is driven by a voltage of a different level for each color.

Then versatile high-quality quasi-color images can be provided even with a two-color structure by controlling the gradations of two colors constituting a pixel. The gradation of light emitted from each of the two light-emitting elements is controlled by changing its driver current or voltage.

Since in the embodiment one pixel is formed by two light-emitting elements, the aperture ratio per pixel is higher than that of the RGB three-color system. In addition, the two-color system is easy to manufacture, compared with the three-color system.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Now embodiments of the present invention will be described below with reference to the accompanying drawings.

Some examples will be explained hereinafter using the case of the formation of light-emitting elements by individual patterning method, but the present inventions are not limited to these examples. Moreover, the following two light-emitting elements forming a pixel have the respective different structure or material of light-emitting film. However, if the light-emitting elements are formed by the photo bleaching process or the color conversion filter (color filter or fluorescent color conversion filter) process, the light emitting film for the two light-emitting elements may be formed with the same structure and material.

Figure 4:
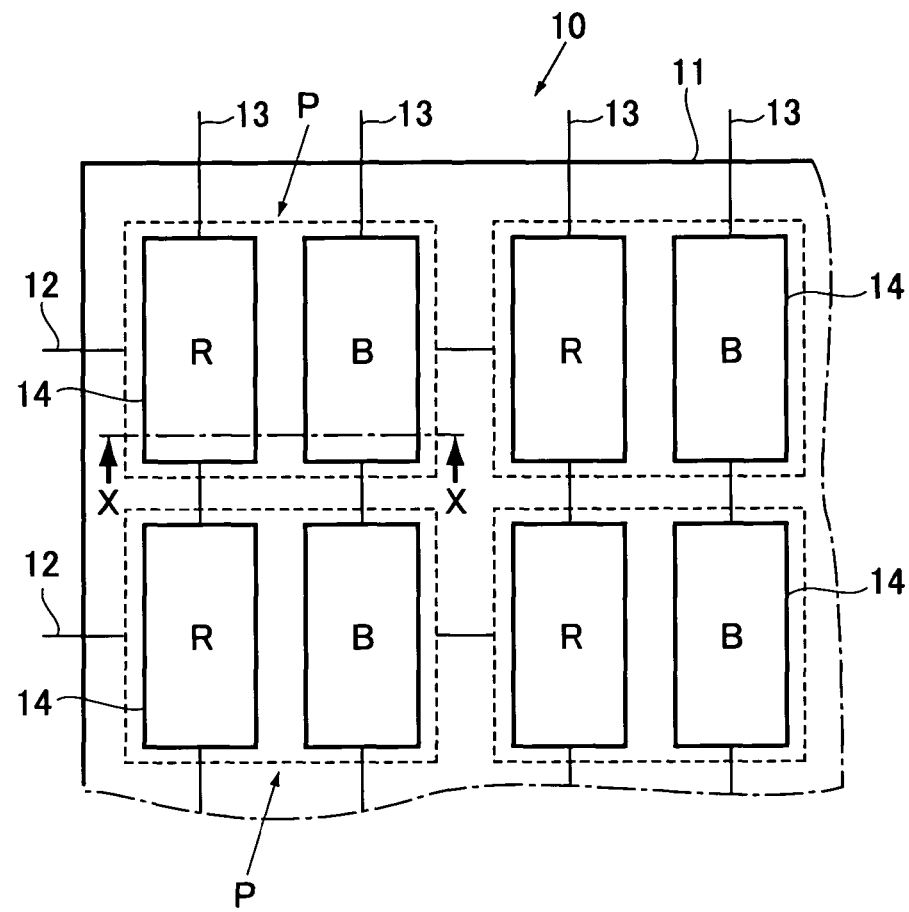
FIG. 4 is a schematic plan view illustrating part of the organic electroluminescent display device according to one embodiment of the present invention.
Figure 5:
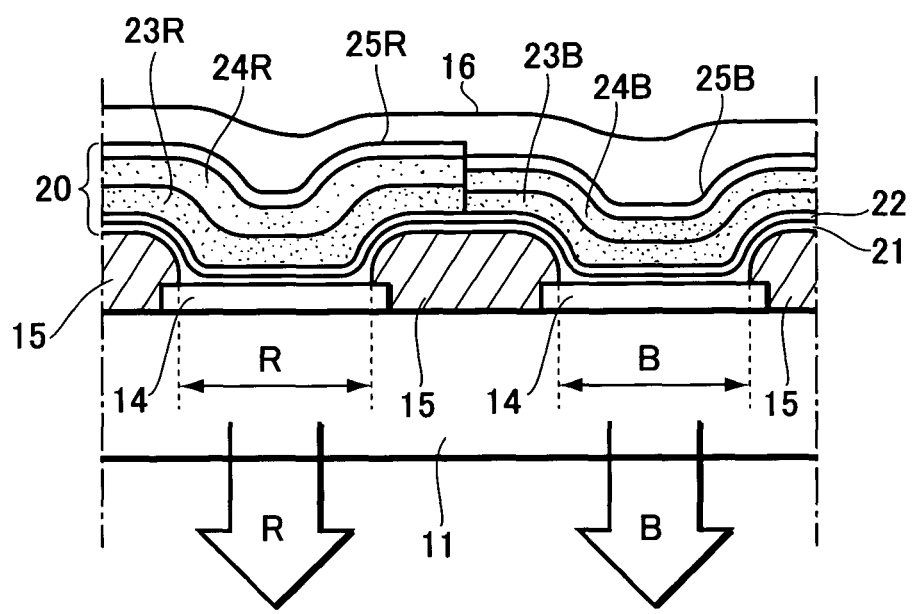
FIG. 5 is a sectional view (taken along the line X-X in FIG. 4) of a vicinity of a pixel of the organic electroluminescent display device according to one embodiment of the present invention.

FIGS. 4 and 5 are diagrams illustrating the organic electroluminescent display device of one embodiment of the present invention; FIG. 4 a schematic plan view illustrating part of the organic electroluminescent display device; and FIG. 5 a sectional view (taken along the line X-X in FIG. 4) of a vicinity of a pixel of the organic electroluminescent display device. In these figures, the organic electroluminescent display device 10 has scan signal lines 12 and data signal lines 13 which intersect each other at right angles on a substrate 11, electrically isolated from each other, and first display electrodes 14 of independent array patterns each corresponding to the light-emitting elements R and B. Each of the first display electrodes 14 is connected to the scan signal line 12 and data signal line 13 (directly connected, or indirectly connected via a non-linear element (not shown) such as thin film transistor). On each of the individual first display electrodes 14, a different organic electroluminescent film 20 is formed for each color, and further a common second display electrode 16 is formed thereon. Although all the data signal lines 13 are drawn to one side of the substrate 11 in this embodiment, those for the light-emitting elements R and B may be separated and drawn to either side each.

In such an organic electroluminescent display device 10, one pixel P is composed of two (R: red; and B: blue) light-emitting elements. Multicolor images are provided by controlling the gradation of each of the light-emitting elements R and B independently (by passive matrix drive scheme or active matrix drive scheme).

The substrate 11 is a transparent substrate made of, for example, glass, and the first display electrode 14 is a transparent electrode made of a transparent conductive material such as ITO (indium tin oxide). A dielectric film 15 made of, for example, polyimide, is formed to fill in between the first display electrodes 14, where signal lines are provided. The second display electrode 16 is a metallic electrode made of, for example, aluminum.

Now an example of the structure of the organic electroluminescent film 20 formed on the first display electrode 14 is explained with reference to FIG. 5. Here, the signal lines 12 and 13 are not shown. On the first display electrode 14 and dielectric film 15 on the substrate 11, a hole injection layer 21 and a hole transport layer 22 are formed. On the hole transport layer 22, a first light-emitting layer 23R, an electron transport layer 24R and an electron injection layer 25R are formed one onto another over the selected area corresponding to the first display electrode 14 to produce a first color. Further, over the selected area corresponding to the first display electrode 14 to be a second color area, a second light-emitting layer 23B, an electron transport layer 24B and an electron injection layer 25B are formed one onto another to produce a second color. To cover the organic electroluminescent films 20 formed on those selected areas for individual colors, the second display electrode 16 is deposited. In this way, the respective light-emitting elements R and B are formed over the areas corresponding to the second display electrode 16 and the first display electrode 14 which intersect each other.

[Chromaticity Control by Selecting Dopant Materials and Concentrations]

In the organic electroluminescent display device 10 of the above structure, the CIE chromaticity of each emitted color can be set to a desired value by selecting dopant materials or their concentrations in the light-emitting layers 23R and 23B. For example, if DCM (Di Cyano Methylene) is used as a dopant in the host material of $Alq_3$ in the light-emitting layer 23R corresponding to the R (red) light-emitting element, the CIE chromaticity, $E_{R2}$ (0.52, 0.43), is obtained in the chromaticity diagram of FIG. 2. Further, the chromaticity can be changed by varying the dopant concentration in the range of 0.1 to a few percent.

In another example, two kinds of dopants (guest materials) can be used in combination in the host material of $Alq_3$ in the R (red) light-emitting layer 23R corresponding to the R light-emitting element. One of such dopant pairs is a combination of rubrene and DCM2 (Di Cyano Methylene2). By changing the dopant concentrations (dopant concentration relative to the host material), specifically, in the range of 0-10% for rubrene and 1-2% for DCM2, the chromaticity can be elaborately controlled.

Figure 1:
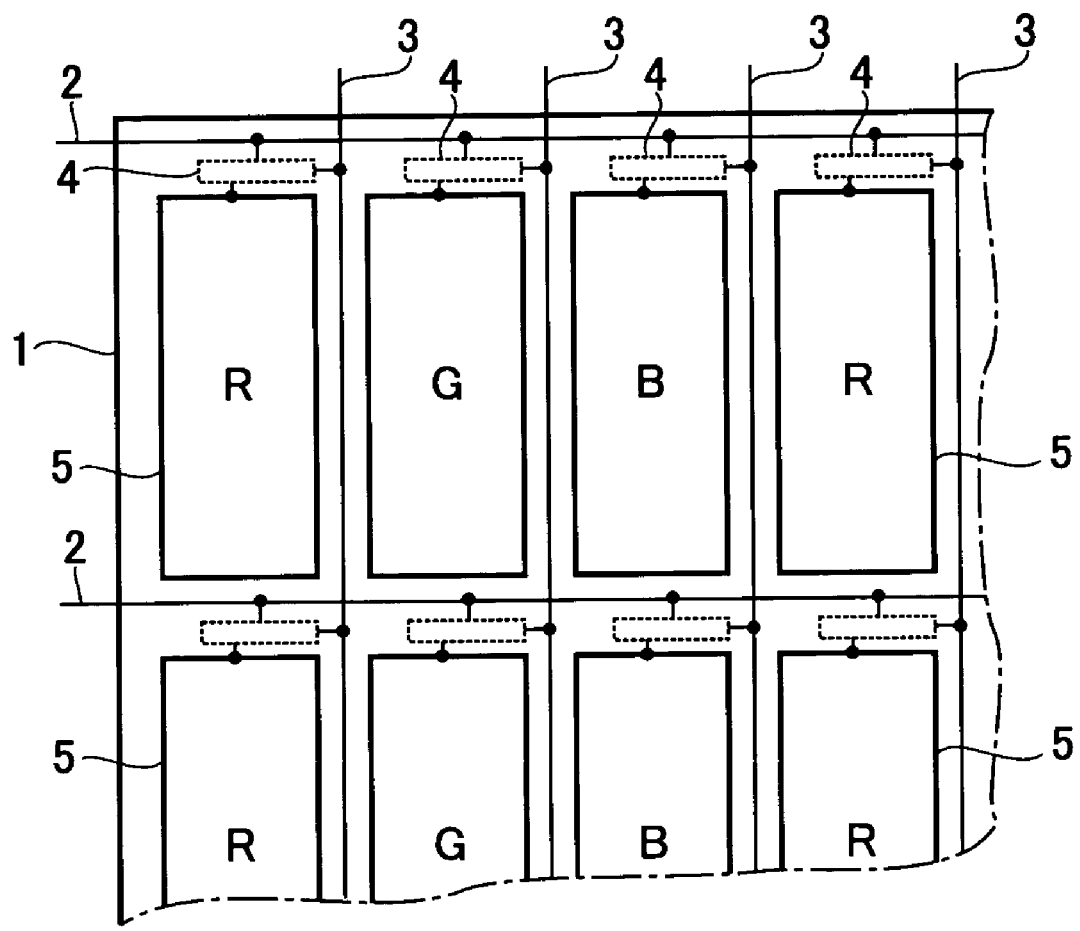
FIG. 1 is an explanatory view illustrating an example of a prior art organic electroluminescent display device.
Figure 2:
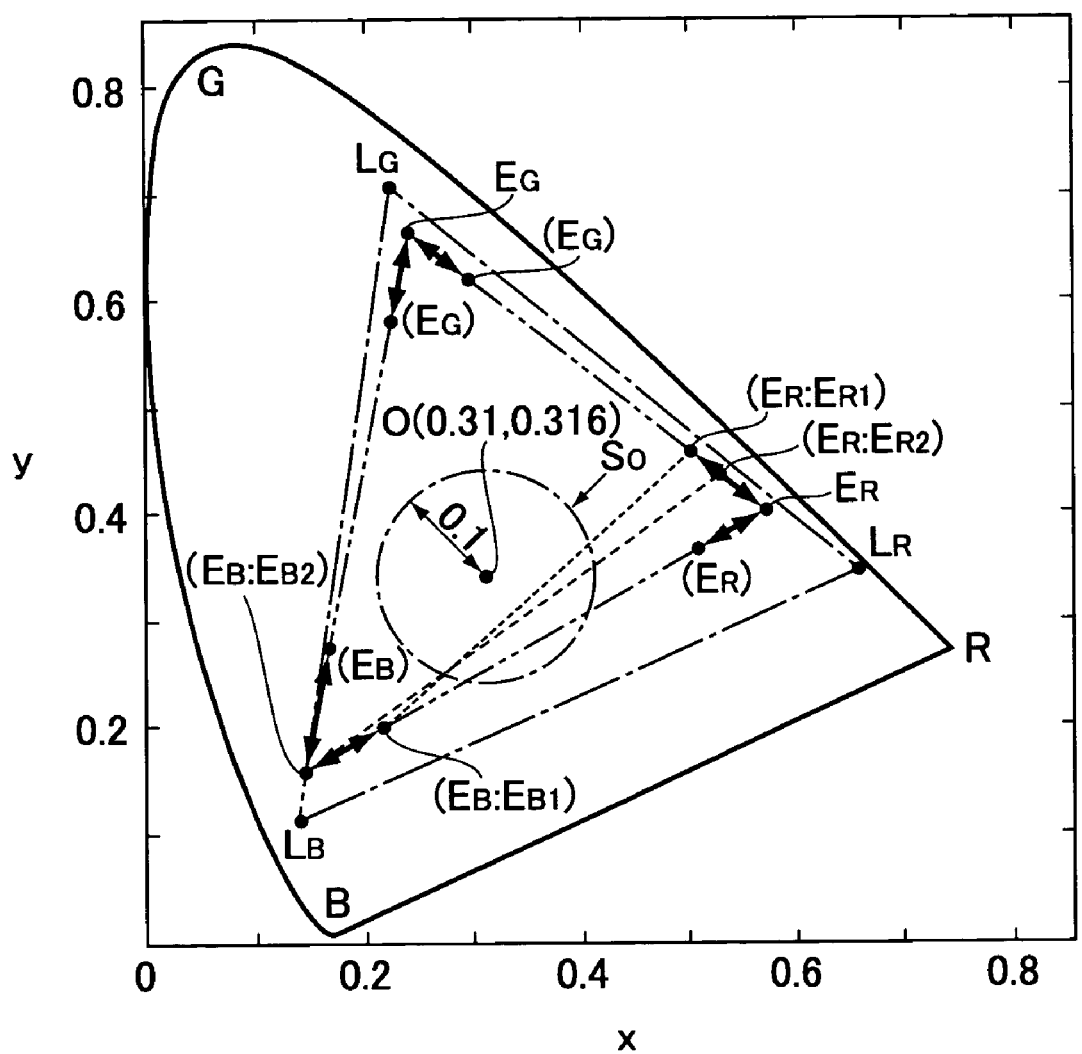
FIG. 2 is a CIE xy chromaticity diagram illustrating an embodiment of the present invention.
Figure 3:
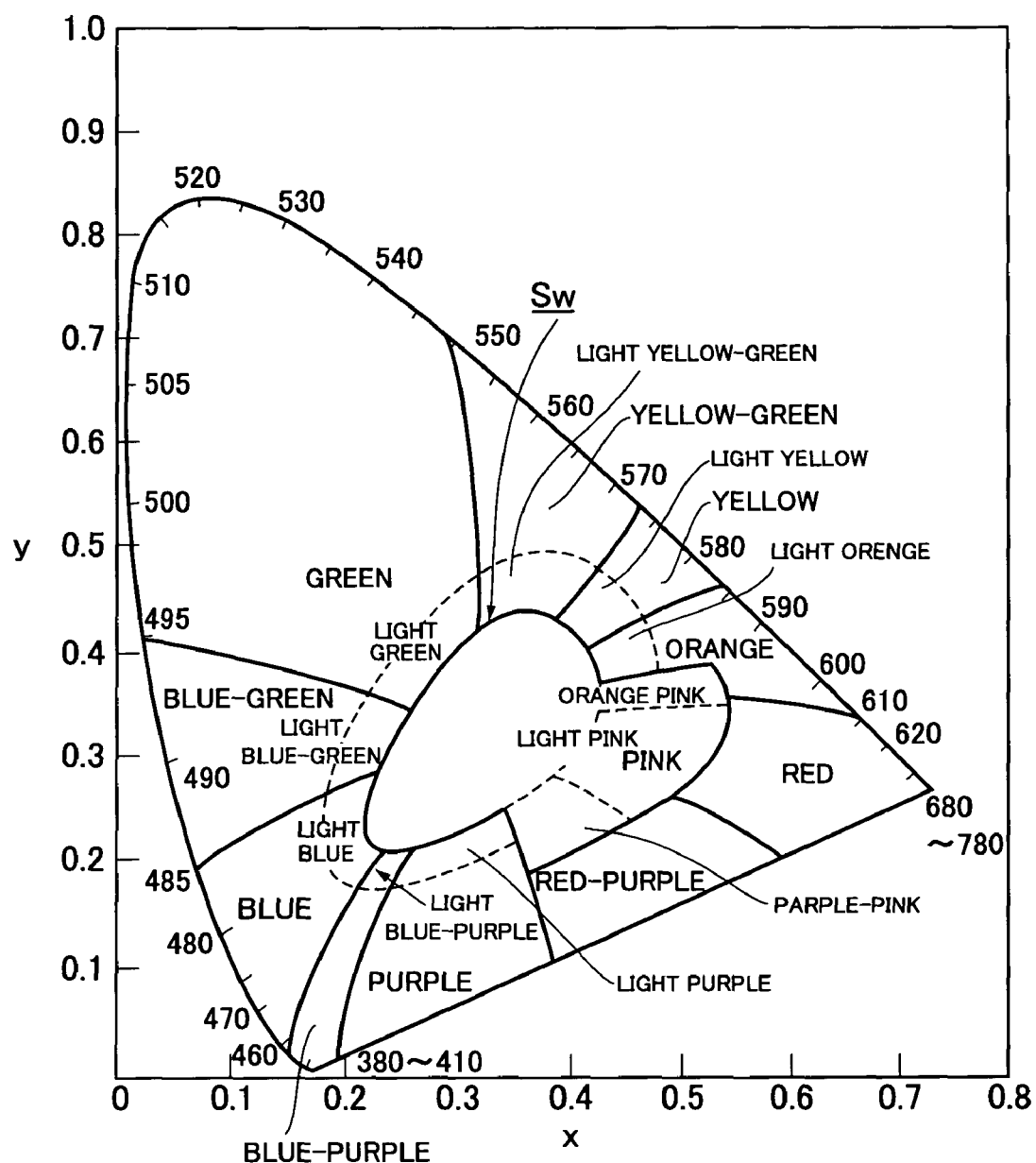
FIG. 3 is a view illustrating a region of white colors in a CIE xy chromaticity diagram (JIS Z 8110).

Meanwhile, in the light-emitting layer 23B corresponding to the B (blue) light-emitting element, perylene can be used as a dopant in the host material of $Alq_3$ to produce a CIE chromaticity $E_{B2}$ (0.14, 0.15) in FIG. 2.

Then, by mixing two colors, namely, CIE chromaticity $E_{R2}$ (0.52, 0.43) in the R light-emitting element and CIE chromaticity $E_{B2}$ (0.14, 0.15) in the B light-emitting element, other colors can be produced within the circular area, $S_O$, of a radius of 0.1, with pure white O (0.31, 0.316) in its center, as shown in FIG. 2.

In the R light-emitting layer 23R where DCM is added as a dopant to the host material of $Alq_3$, the higher the DCM concentration the closer to red (R) the emitted light, while the lower the DCM concentration the closer to yellow (Y). Yellow Y (0.4, 0.53) appears when the dopant concentration for red is reduced to ⅕. If the dopant concentration is zero, the obtained color becomes close to green (G).

In this way, with $Alq_3$ as the host and DCM as the dopant, it is possible to change colors continuously, from red to green via yellow, by controlling the dopant concentration. By mixing two colors, specifically, chromaticity Y (0.4, 0.53) of the R light-emitting element and chromaticity $E_{B2}$ (0.14, 0.15) of the B light-emitting element, various colors can be produced within the circular area, $S_O$, of a radius of 0.1, with pure white O (0.31, 0.316) in its center, as shown in FIG. 2.

[Combination with a White Light-Emitting Element]

A white color of chromaticity (0.31, 0.34) can be provided by a two-color layered structure where the aforementioned yellow light-emitting layer is deposited on the blue light-emitting layer 23B in the B light-emitting element. By combining this white light-emitting element with the aforementioned R light-emitting element or with one of among green (G), blue (B), cyan (C), magenta (M) and yellow (Y), the color can be changed from white to a single color.

[Chromaticity Control by Changing the Thickness of the Electroluminescent Film]

In the above organic electroluminescent display device 10, it is possible to change chromaticity of emitted light by changing the hole injection layer 21 and the hole transport layer 22 (hole transport functional layer) in thickness, while using the same materials for the electroluminescent film 20. The mechanism behind this is reflection/interference between the layers as described before. Indeed, the CIE chromaticity of R and that of B can be shifted toward the G side in the individual light-emitting elements R and B, while the CIE chromaticity of G can be shifted toward the R side in the G light-emitting element. Then, by combining the set two chromaticity values, various colors can be produced in the circular area, $S_O$, of a radius of 0.1, with pure white O (0.31, 0.316) in its center, as shown in FIG. 2.

[Array Patterns for Light-Emitting Element]

The light-emitting elements R and B (corresponding to the position of the first display electrode 14) in the organic electroluminescent display device 10 that shows images with dots are arrayed in a grid pattern as shown in FIG. 4. Different colors may be arrayed at least every other line in the figure, but the array pattern is not limited to this grid one.

Figure 6:
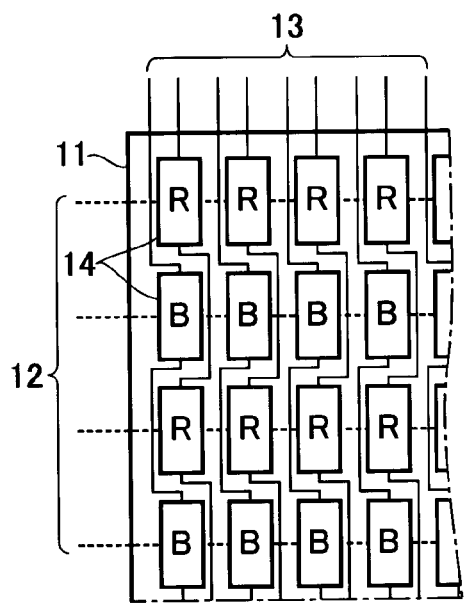
FIG. 6($a$) through FIG. 6($d$) show examples of the array patterns of light-emitting elements according to one embodiment of the present invention.
Figure 6:
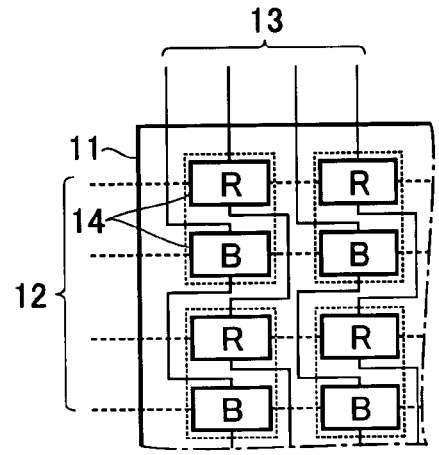
Figure 6:
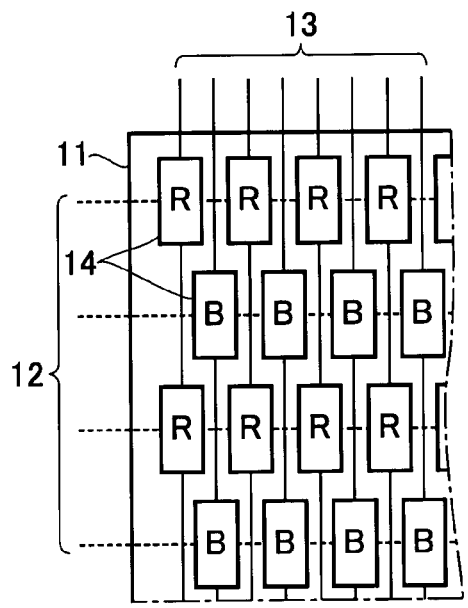
Figure 6:
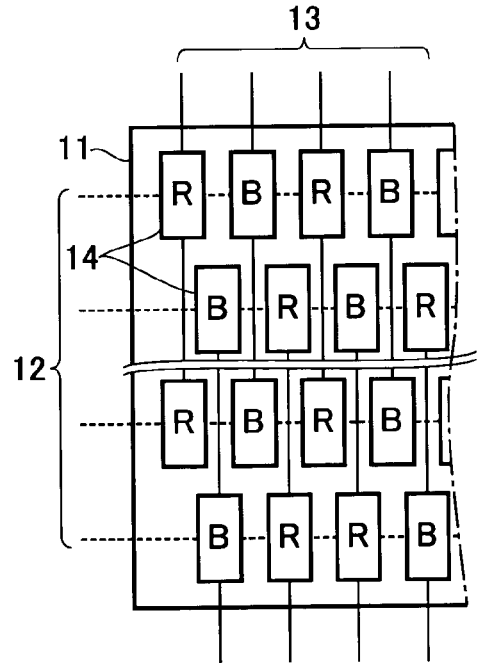

Other examples of the array patterns for the light-emitting elements are shown in FIG. 6(a) through FIG. 6(d). FIG. 6(a) is a pattern where the light-emitting elements R and B are arrayed in a grid pattern and the color is alternated at least every other row. FIG. 6(b) is a similar pattern, but the first display electrodes 14 are extended in the lateral direction. In these examples, the scan signal lines 12 are drawn to the left side of the substrate 11, and the data signal lines 13 are drawn to the top side. However, the data signal lines 13 may be separated by color and drawn to either top or bottom side each. Further, in a similar pattern, different colors may be arrayed every other row and column.

In the example of FIG. 6(c), the light-emitting elements R and B are arrayed in a staggered pattern and the color is changed at least every other row. In these examples, the scan signal lines 12 are drawn to the left side of the substrate 11 and the data signal lines 13 are drawn to the top side. However, the data signal lines 13 may be separated by color and drawn to either top or bottom side each. Further, in a similar pattern, different colors may be arrayed every other column.

In the example of FIG. 6(d), the light-emitting elements R and B are arrayed in a staggered pattern, and the color is changed at least every other row and column. In this example, the scan signal lines 12 are drawn to the left side of the substrate 11, and the data signal lines 13 are separated by color and drawn to either top or bottom side each.

The organic electroluminescent elements forming the light-emitting elements R and B are driven by an electric current or voltage. Each color is driven by the respective different current or voltage. Then by controlling the gradation of each color independently, even a two-color structure can provide various colors, with white in the center, for achieving high-quality quasi-color imaging.

EXAMPLES FOR CONTROL

Example for Chromaticity Control

An example for controlling chromaticity of light-emitting element R and B is shown in the following table 1.

TABLE 1

AN EXAMPLE FOR CHROMATICITY SETTING OF LIGHT-EMITTING ELEMENT R AND B

|  | CONSTITUTION OF LIGHT-EMITTING ELEMENT R | CONSTITUTION OF LIGHT-EMITTING ELEMENT B |
|---|---|---|
| HOLE INJECTION LAYER | CuPc | CuPc |
| (FILM THICKNESS) | 20 nm | 20 nm |
| HOLE TRANSPORT LAYER | a-NPD | a-NPD |
| (FILM THICKNESS) | 40 nm | 40 nm |
| LIGHT-EMITTING LAYER |  |  |
| HOST | Alq3 | IDE120 |
| GUEST | DCJTB | IDE102 |
| (FILM THICKNESS) | 30 nm | 30 nm |
| ELECTRON TRANSPORT LAYER | Alq3 | Alq3 |
| (FILM THICKNESS) | 50 nm | 20 nm |
| CATHODE | Mg-Ag | Mg-Ag |
| (FILM THICKNESS) | 100 nm | 100 nm |
| CHROMATICITY | (0.61, 0.39) | (0.17, 0.30) |

IDE120 is organic host emissive material and IDE102 is organic guest emissive material both produced by Idemitsu Kosan Co.,Ltd..

Figure 7:
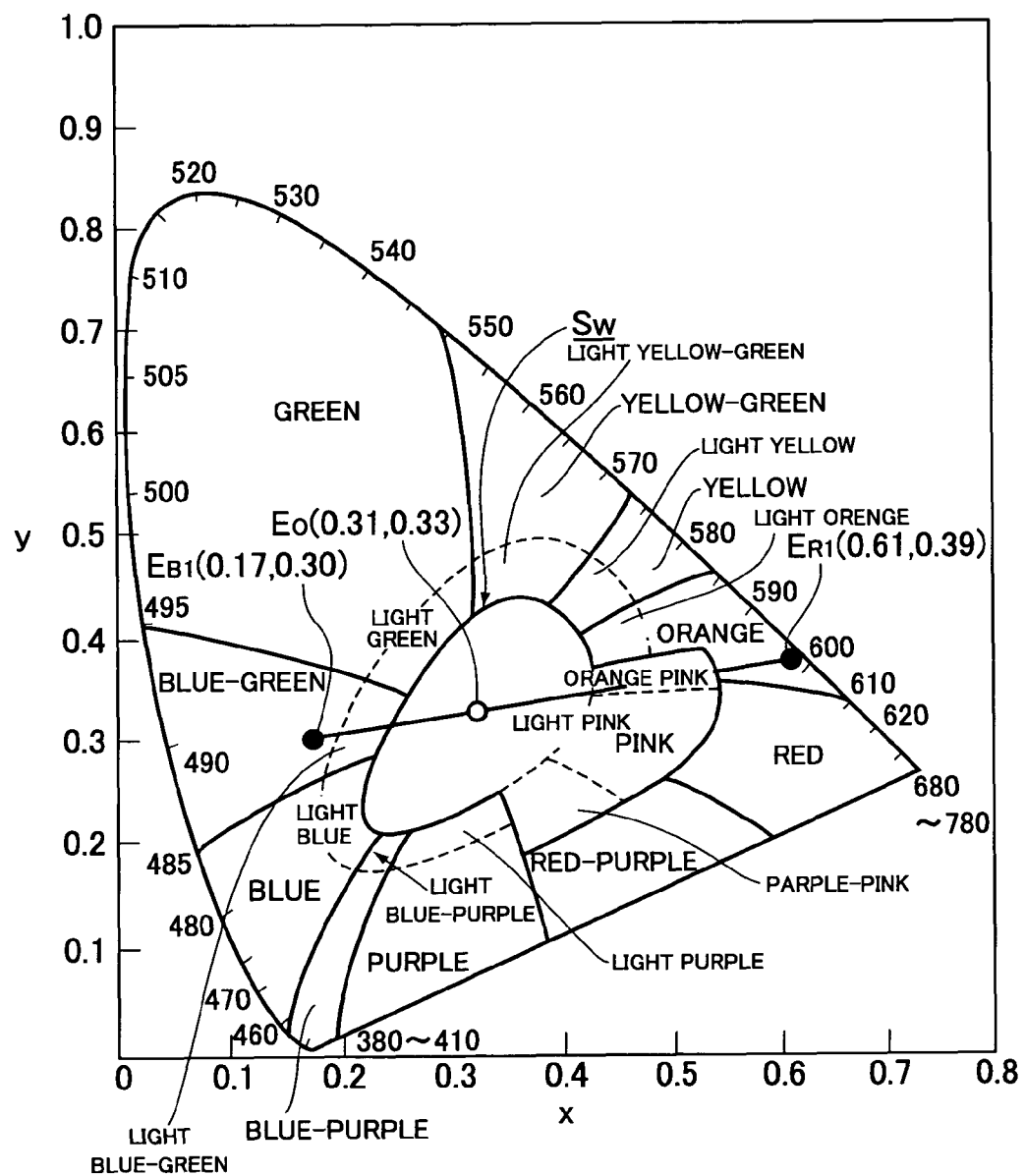
FIG. 7 is an explanatory view illustrating an example of chromaticity control of one further embodiment.

The chromaticity controlled by the above table is $E_{R1}$ (0.61, 0.39) and $E_{B1}$ (0.17, 0.30) respectively, and shown in CIE xy chromaticity diagram in FIG. 7.

Example for Brightness Control

Colors on the line segment between $E_{R1}$ and $E_{B1}$ in FIG. 7 can be displayed on this display device, by controlling each gradation of the two light-emitting elements. The point on this line segment nearest to the pure white (0.31, 0.316) is an objective white, the chromaticity of which is Eo(0.31, 0.33). To obtain the objective white in brightness of 50 cd/m$^2$, each required brightness of light-emitting element R and B is 18 cd/m$^2$ and 32 cd/m$^2$, respectively.

By controlling brightness of the light-emitting element R and B respectively, quasi-color display using multicolor on the line segment in FIG. 7 can be attained. This quasi color display realized by even a mixture of two colors with the white color in the center has an ability of versatile color display, and moreover has advantages of high aperture ratio, ease of fabrication and decrease in usage of organic materials, comparing to a color display using three colors. Thus, this type of display results in the very effective display mode as a color display in the organic light-emitting display device.

(Lifetime Design)

The measured lifetimes of light-emitting elements at the brightness ratio mentioned above (light-emitting element R and B is 18 cd/m$^2$ and 32 cd/m$^2$ respectively) allow us to design a ratio of emissive areas of light-emitting elements, to equalize the different lifetimes.

The measured value in lifetime of light-emitting element R and B is 5000 hours and 2500 hours, respectively, in the case of a passive matrix panel with 50% aperture ratio and 1/64 duty drive. The lifetime is measured as a decreasing ratio of brightness vs. time at normal temperature. The design of area ratio with regard to this lifetime is shown in the following Table 2.

TABLE 2

AN EXAMPLE FOR AREA RATIO DESIGN
WITH REGARD TO LIFETIME OF ELEMENT

| | CHROMATICITY (x, y) | BRIGHT-NESS | LIFETIME | AREA RATIO |
|---|---|---|---|---|
| ELEMENT B | (0.17, 0.30) | 32 cd/m$^2$ | 2500 hrs. | 2 |
| ELEMENT R | (0.61, 0.39) | 18 cd/m$^2$ | 5000 hrs. | 1 |

By this setting, versatile high-quality quasi-color display becomes available, and the lifetime design of display device also becomes easy.

In the above embodiments, the light-emitting elements R and B have been exemplified. However, any combination among R and G, G and B, or any two colors among red (R), green (G), blue (B), cyan (C), magenta (M) and yellow (Y), may be used in the two-color structure. Further, the combinations of white and one of the above six colors may be used.

While there has been described what are at present considered to be preferred embodiments of the present invention, it will be understood that various modifications may be made thereto, and it is intended that the appended claims cover all such modifications as fall within the true spirit and scope of the present invention.

What is claimed is:

1. An organic electroluminescent display device comprising:
   a plurality of pixels located above a substrate, each pixel being formed of two light-emitting elements and producing only two different colors of predetermined chromaticity values,
   wherein each light-emitting element is formed by interposing a luminescent layer containing organic electroluminescent materials between a pair of electrodes, the light-emitting elements being arranged in a plurality of independent array patterns,
   wherein a mixture of the two different colors produces colors falling within a line segment between two different colors by controlling each gradation of the two light-emitting elements in a ClExy chromaticity diagram,
   wherein a part of the color falling within the line segment produce colors falling within a circular area of a 0.1 radius with a center in a pure white coordinate of 0.31, 0.36 in the ClExy chromaticity diagram, and
   wherein the two light-emitting elements are driven by different electric currents or voltages to achieve a quasi-color display.

2. The organic electroluminescent display device according to claim 1, wherein said two different colors are selected from red (R), green (G), blue (B), cyan (C), magenta (M) and yellow (Y).

3. The organic electroluminescent display device according to claim 1, wherein one of said two different colors is white and the other is one selected from red (R), green (G), blue (B), cyan (C), magenta (M) and yellow (Y).

4. The organic electroluminescent display device according to claim 1, wherein said chromaticity values of two different colors are controlled by changing a concentration ratio of said organic electroluminescent materials or by coupling with a foreign material.

5. The organic electroluminescent display device according to claim 1, wherein said chromaticity values of two colors are controlled by changing thickness of a light-emitting film.

6. The organic electroluminescent display device according to claim 1, wherein said light-emitting elements are fabricated by a photo bleaching process applied to a light-emitting film.

7. The organic electroluminescent display device according to claim 1, wherein each said light-emitting element is formed corresponding to every color filter which converts a color of light emitted from a light-emitting film, respectively.

8. The organic electroluminescent display device according to claim 1, wherein each said light-emitting element is formed corresponding to every luminescent color conversion filter which converts a color of light emitted from a light-emitting film, respectively.

9. The organic electroluminescent display device according to claim 1, wherein a light-emitting film is formed by a coating method or a printing method.

10. The organic electroluminescent display device according to claim 1, wherein said two different color light-emitting elements have different emissive areas based on each lifetime of said light-emitting elements.

11. The organic electroluminescent display device according to claim 1, wherein said light-emitting element is driven by an electric current of a different level for each color.

12. The organic electroluminescent display device according to claim 1, wherein said light-emitting element is driven by a voltage of a different level for each color.

* * * * *